(12) United States Patent
Ogawa

(10) Patent No.: US 7,235,477 B2
(45) Date of Patent: Jun. 26, 2007

(54) MULTI-LAYER INTERCONNECTION CIRCUIT MODULE AND MANUFACTURING METHOD THEREOF

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/166,970

(22) Filed: Jun. 24, 2005

(65) Prior Publication Data

US 2005/0250310 A1 Nov. 10, 2005

Related U.S. Application Data

(62) Division of application No. 10/488,499, filed as application No. PCT/JP03/07826 on Jun. 19, 2003.

(30) Foreign Application Priority Data

Jul. 3, 2002 (JP) ............................ P2002-195018

(51) Int. Cl.
*H01L 21/4763* (2006.01)

(52) U.S. Cl. ...................... 438/622; 438/438; 438/623; 438/626; 438/631; 438/E23.172

(58) Field of Classification Search ........ 438/622–623, 438/626, 631, 107, 125; 257/758
See application file for complete search history.

(56) References Cited

U.S. PATENT DOCUMENTS 4,336,088 A 6/1982 Hetherington et al.
5,231,751 A 8/1993 Sachdev et al.
6,399,897 B1* 6/2002 Umematsu et al. ......... 174/261
6,400,576 B1 6/2002 Davidson
6,577,490 B2 6/2003 Ogawa et al.
6,591,491 B2* 7/2003 Fujii et al. .................... 29/830
6,638,854 B2* 10/2003 Homma et al. ............. 438/633

(Continued)

FOREIGN PATENT DOCUMENTS

EP 1 137 060 9/2001

(Continued)

*Primary Examiner*—Thao X. Le
(74) *Attorney, Agent, or Firm*—Robert J. Depke; Rockey, Depke, Lyons & Kitzinger LLC

(57) ABSTRACT

The present invention is directed to a multi-layer interconnection circuit module in which plural unit wiring layers are interlayer-connected to each other through a large number of via holes so that they are laminated and formed, wherein respective unit wiring layers (8) to (12) are adapted so that photo-lithographic processing is implemented to a first insulating layer (22) formed by photosensitive insulating resin material to form via hole grooves (25), and photo-lithographic processing is implemented to a second insulating layer (23) formed by photosensitive insulating resin material on the first insulating layer (22) to form wiring grooves (27). A conductive metal layer (24) is formed on the second insulating layer (23) in such a manner that conductive metal is filled within the via hole grooves (25) and the wiring grooves (27) to implement polishing processing to the conductive metal layer (24) until the principal surface of the second insulating layer (23) is exposed to form via holes (13) and wiring patterns (26) by the conductive metal filled within the via hole grooves (25) and the wiring grooves (27).

6 Claims, 7 Drawing Sheets

U.S. PATENT DOCUMENTS

| | | |
|---|---|---|
| 6,881,662 B2 * | 4/2005 | Kung et al. .................. 438/629 |
| 6,904,674 B2 | 6/2005 | Mune et al. |
| 6,958,544 B2 * | 10/2005 | Sunohara .................... 257/758 |
| 2003/0044588 A1 * | 3/2003 | Komoto et al. ............. 428/209 |
| 2004/0119166 A1 | 6/2004 | Sunohara |
| 2004/0227222 A1 | 11/2004 | Kikuchi et al. |

FOREIGN PATENT DOCUMENTS

| | | |
|---|---|---|
| JP | 2000-261141 | 9/2000 |
| JP | 2001-267747 | 9/2001 |
| JP | 2002-164467 | 6/2002 |

* cited by examiner

MULTI-LAYER INTERCONNECTION CIRCUIT MODULE AND MANUFACTURING METHOD THEREOF

The subject matter of application Ser. No. 10/488,499 is incorporated herein by reference. The present application is a divisional of U.S. application Ser. No. 10/488,499, filed Mar. 2, 2004, which claims priority to Japanese Patent Application No. JP2002-195018, filed Jul. 3, 2002, and WIPO Application No. PCT/JP03/07826, filed Jun. 19, 2003. The present application claims priority to these previously filed applications.

TECHNICAL FIELD

The present invention relates to a multilayer interconnection circuit module in which thin structure and high density wiring have been realized, and a manufacturing method thereof.

This Application claims priority of Japanese Patent Application No. 2002-195018, field on Jul. 3, 2002, the entirety of which is incorporated by reference herein.

BACKGROUND ART

In various digital electronic equipments, e.g., personal computer, mobile telephone, video equipment and/or audio equipment, etc., there is provided multi-chip circuit module on which semiconductor chips such as various IC elements or LSI elements, etc. are mounted. In various digital electronic equipments, finning of circuit pattern, miniaturization of IC package, rapid improvement in integration scale, multi-pin structure and/or improvement in mounting method, etc. have been provided so that miniaturization and high level function of the multi-chip circuit module are realized. Thus, miniaturization and light weight, and/or thin structure are realized, and high performance, high level function, multi-function and/or high speed processing, etc. have been realized.

In multi-chip circuit modules, there are also circuit modules where the so-called system LSI on which circuits having different functions, e.g., logic function and memory function or analog function and digital function, etc. are mounted are constituted. In the multi-chip circuit modules, there are also circuit modules in which the so-called multi-chip circuit module where functional blocks of respective processes are manufactured as individual semiconductor chips and these semiconductor chips are mounted on the same board is constituted.

Meanwhile, in the multi-chip circuit module, in order to realize further improvement in performance, realization of high speed of microprocessor and/or realization of high density of signal wiring between memory chips are required, and it is necessary to take a measure for the problem of wiring delay. In the multi-chip circuit module, even if clock frequency above GHz is realized within respective elements (chips), clock frequency must be lowered in digit units owing to the problems such as signal delay and/or reflection, etc. based on wirings between chips. In addition, in the multi-chip circuit module, realization of high speed of signal wiring and/or realization of high density are provided to thereby also require countermeasure for, e.g., EMI (electromagnetic interference) or EMC (electromagnetic compatibility). Accordingly, in the multi-chip circuit module, it is necessary to provide realization of high integration and/or high performance on the whole as a system technology including mounting technology for package or board, etc. in addition to improvement in formation technology for chip.

Hitherto, as the multi-chip circuit module, there is a circuit module as shown in FIG. 1. The circuit module shown in FIG. 1 is a multi-chip circuit module 100 of the flip-chip type in which plural semiconductor chips 102A, 102B are mounted on a principal surface 101a of an interposer 101. The multi-chip circuit module 100 is adapted so that suitable circuit patterns, lands and/or input/output terminals, etc. are respectively formed on the surface principal surface 101a and the back principal surface 101b of the interposer 101 are formed. In the multi-chip circuit module 100, at the principal surface 101a of the interposer 101, respective semiconductor chips 102 are mounted in the state where they are respectively flip-chip connected on predetermined lands 103 and connecting portions are covered by underfill 104 on the principal surface 101a of the interposer 101. At the multi-chip circuit module 100, solder balls 105 are respectively mounted at lands formed at the principal surface 101b of the interposer 101, and reflow solder processing is implemented in the state where they are mounted on, e.g., mother board, etc. to melt and solidify the solder balls 105. Thus, the multi-chip circuit module is mounted.

As described above, at the conventional multi-chip circuit module 100, plural semiconductor chips 102 are mounted in lateral arrangement state on the principal surface 101a of the interposer 101. However, wirings which connect respective semiconductor chips 102 are restricted by circuit patterns formed at the interposer 101 side. In the multi-chip circuit module 100, with realization of multi-function and realization of high speed, etc. of the apparatus where this module 100 is mounted, a large number of semiconductor chips 102 are provided. Thus, a larger number of wirings are required. In the multi-chip circuit module 100, because pitch of wiring pattern formed at the interposer 101 manufactured by the general board (substrate) manufacturing technology is large value of the order of about 100 µm even at the minimum by restriction of manufacturing condition, etc., interposer 101 of large area or caused to be of multilayer structure is required in the case where a large number of connections are made between plural semiconductor chips 102.

In the multi-chip circuit module 100, in the case where multi-layered interposer 101 is used, interlayer connection through via and/or connection between respective semiconductor chips 102 are conducted. In this case, since its hole diameter is about 50 µm even at the minimum from the processing condition, and land diameter is also about 50 µm even at the minimum, large-sized interposer 101 is required. For this reason, at the multi-chip circuit module 100, there were the problems that wiring pattern formed at the interposer 101 which connects respective semiconductor chips 102 is elongated, and many vias are formed so that L•C•R components become large.

For example, in the manufacturing process for the semiconductor device, there has been also proposed a technology in which an insulating layer is formed as film on a silicon substrate thereafter to form fine wiring pattern via dry etching step of forming via grooves and wiring grooves and film formation step for conductive metal layer. In such wiring formation method, first dry etching processing is implemented to an insulating layer to form a large number of via grooves, and second dry etching processing is implemented to form wiring grooves as pattern. In this wiring formation method, copper film layer is formed by, e.g., plating on the entire surface of the insulating layer thereafter to implement polishing processing to this copper film layer to thereby form via holes and a predetermined wiring pattern.

In accordance with such wiring formation method, as compared to the typical wiring formation method of forming via holes by machining or laser processing and implementing etching processing to copper foil to form circuit pattern, it is possible to form fine and high density wiring pattern as multi-layer structure. In this wiring formation method, it is necessary to implement precise first dry etching processing and precise second dry etching processing having depths of groove different from each other, and it is difficult to apply this method to manufacturing process for typical multi-layer wiring board. In addition, in accordance with this wiring formation method, since wiring layers are formed on silicon substrate as multi-layer structure, there are the problem that the mounting structure onto mother board, etc. becomes complicated so that realization of miniaturization becomes difficult, and wiring pattern is also elongated.

DISCLOSURE OF THE INVENTION

An object of the present invention is to provide a novel multi-layer interconnection (wiring) circuit module and a manufacturing method thereof which can solve problems that conventional multi-chip circuit modules as described above have.

Another object of the present invention is to provide a multi-layer interconnection (wiring) circuit module and a manufacturing method thereof in which respective unit wiring layers have fine and high density wiring patterns and have Via-on-Via structure so that interlayer connection is conducted by the shortest wiring length, miniaturization and thin structure can be realized, and high speed processing and improvement in reliability can be realized.

A multilayer interconnection circuit module according to the present invention is adapted so that plural unit wiring layers are interlayer-connected through a large number of via holes so that they are laminated, wherein each unit wiring layer is composed of a first insulating layer, a second insulating layer, and a conductive metallic layer to which polishing processing is implemented. The first insulating layer is formed as film by photosensitive insulating resin material, and photo-lithographic processing is implemented so that a large number of via hole grooves corresponding to respective via holes are formed. The second insulating layer is formed as film by photosensitive insulating resin material on the first insulating layer, and photo-lithographic processing is implemented so that communicating portions with respective via hole grooves provided at a portion thereof and wiring grooves corresponding to wiring patterns are formed as pattern. The conductive metallic layer is formed as film over the entire surface of the second insulating layer in the state where conductive metal is filled also within respective via hole grooves and wiring grooves. Polishing processing is implemented to respective unit wiring layers until the principal surface of the second insulating layer is exposed so that respective via holes and wiring patterns are formed by conductive metal filled within respective via hole grooves and wiring grooves of the conductive metallic layer exposed in such a manner to constitute the same surface on the principal surface of the second insulating layer.

In accordance with the multi-layer interlayer circuit module according to the present invention, photo-lithographic processing by simple equipment and work are respectively implemented to the first and second insulating layers formed as film by photosensitive insulating resin material to form via hole grooves and wiring grooves which have high resolution. From this fact, it becomes possible to form micro via holes and/or fine and high density wiring pattern. In accordance with the multi-layer interconnection (wiring) circuit module, respective unit wiring layers are interlayer-connected to each other at the shortest distance by Via-on-Via structure so that they are laminated and formed to thereby shorten wiring length. As a result, attenuation of signals caused to undergo transmission is reduced, and signal delay is minimized. In addition, thin structure is realized, thus making it possible to cope with, e.g., large capacity, high speed and high density bus.

A method of manufacturing multi-layer interconnection circuit module according to the present invention is directed to a method of manufacturing a multi-layer interconnection circuit module in which plural unit wiring layers are interlayer-connected to each other through a large number of via holes so that they are laminated. In this manufacturing method for multi-layer interconnection circuit module, the step of forming respective unit wiring layers consists of a step of forming a first insulating layer by photosensitive insulating resin material, a step of implementing photo-lithographic processing to the first insulating layer to form a large number of via hole grooves corresponding to respective via holes, a step of coating photosensitive insulating resin material onto the entire surface of the first insulating layer to form a second insulating layer as film, a step of implementing photo-lithographic processing to the second insulating layer to form wiring grooves corresponding to wiring patterns including communicating portions with respective via hole grooves at a portion thereof, a step of filling conductive metal also within the respective via hole grooves and wiring grooves to form conductive metal layer as film on the entire surface of the second insulating layer, and a step of polishing the conductive metal layer until the principal surface of the second insulating layer is exposed. The respective via holes and the wiring patterns are formed by conductive metal filled within respective via hole grooves and wiring grooves of the conductive metallic layer exposed in such a manner to constitute the same surface on the principal surface of the second insulating layer as the result of the fact that polishing processing has been implemented. In this manufacturing method, the unit wiring layer of the first layer is adapted so that the first insulating layer is formed as film on the base substrate, and the unit wiring layers of the upper layer are adapted so that respective first insulating layers are formed as film on the second insulating layer of the unit wiring layer of the lower layer.

In accordance with the manufacturing method for multi-layer interconnection circuit module according to the present invention, photo-lithographic processing is implemented to the first and second insulating layers formed as film by photosensitive insulating resin material to form via hole grooves and wiring grooves which have high resolution. From this fact, it becomes possible to form micro via holes and/or fine and high density wiring patterns. By using this manufacturing method, respective unit wiring layers are interlayer-connected to each other at the shortest distance by Via-on-Via structure so that they are laminated and formed to thereby shorten wiring length. As a result, attenuation of signals caused to undergo transmission is reduced, signal delay is minimized, and thin structure can be realized. Thus, it is possible to manufacture multi-layer interconnection (wiring) circuit module in which, e.g., measure for large capacity, high speed and high density bus has been realized.

Still further objects of the present invention and practical merits obtained by the present invention become more apparent from the description of the embodiments which will be given below with reference to the attached drawings.

BEST MODE FOR CARRYING OUT THE INVENTION

A multi-layer interconnection (wiring) circuit module (hereinafter simply abbreviated as circuit module) and a manufacturing method thereof to which the present invention is applied will now be explained with reference to the attached drawings.

The circuit module according to the present invention has, e.g., information communication function and/or storage function, etc., and is mounted in various electronic equipments such as personal computer, mobile telephone and/or audio equipment, etc., or constitutes a high frequency circuit unit of micro communication function module body attached or detached as option. At the circuit module, although its detail is omitted, there is formed a high frequency transmitting/receiving circuit unit based on the superheterodyne system for once performing conversion into intermediate frequency from transmit/receive signal, or a high frequency transmitting/receiving circuit unit based on the direct conversion system for performing transmission/reception of information signals without conducting conversion into intermediate frequency, etc.

Figure 2:
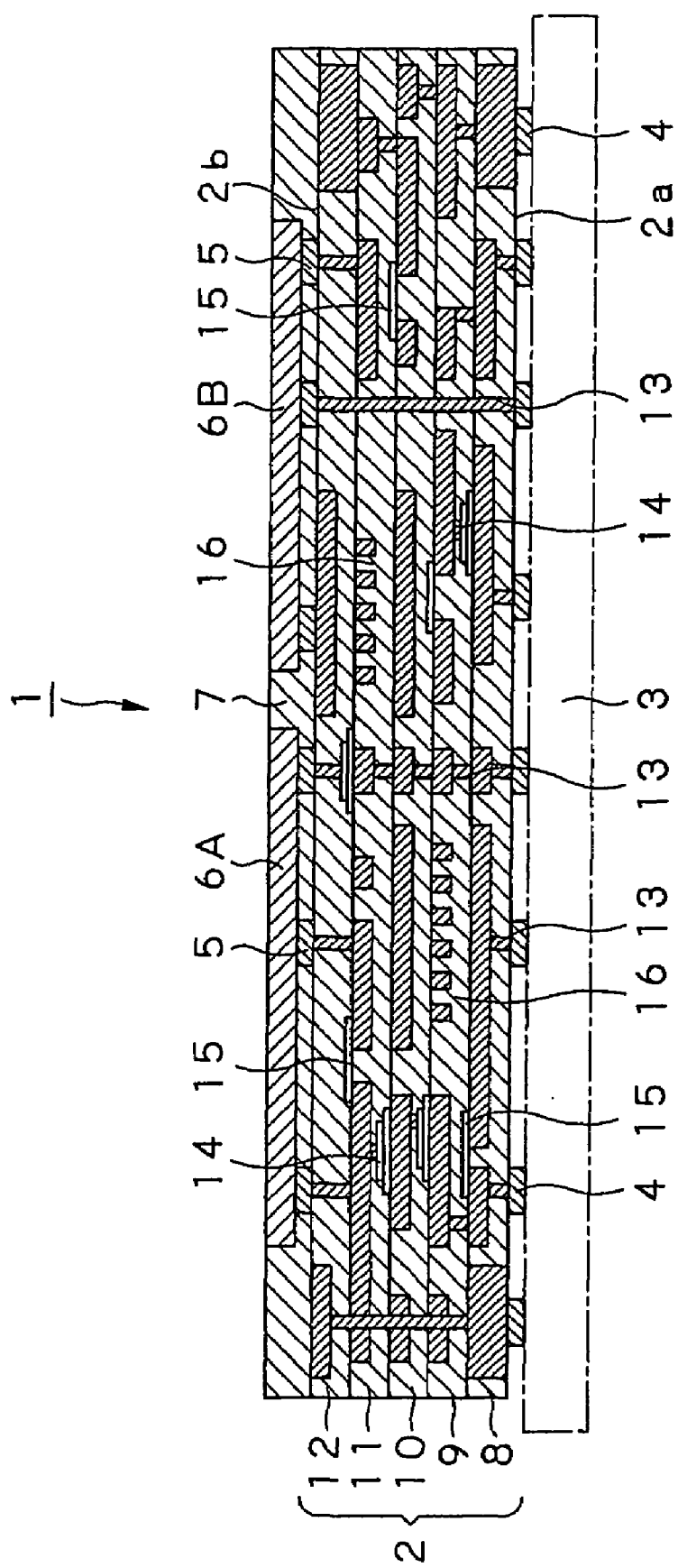
FIG. 2 is an essential part longitudinal cross sectional view showing a circuit module according to the present invention.

As shown in FIG. 2, the circuit module 1 according to the present invention is composed of a multi-layer interconnection (wiring) circuit portion 2 having a first principal surface 2a as a mounting surface and mounted through bumps 4 for mounting on a mother board 3, plural (two in FIG. 2) semiconductor chips (LSI) 6A, 6B mounted through a large number of semiconductor mounting bumps 5 on a second principal surface 2b of the multi-layer wiring circuit portion 2, and a sealing resin layer 7 for sealing these semiconductor chips 6A, 6B. At the circuit module 1, the multi-layer wiring circuit portion 2 functions as interposer in which semiconductor chips 6A, 6B are mounted. It is to be noted that, at the circuit module 1 according to the present invention, suitable electronic parts (components) and/or element parts are also mounted on the second principal surface 2b of the multi-layer wiring circuit portion 2 although not shown.

In the circuit module 1 according to the present invention, the multilayer wiring circuit portion 2 is constituted by five layer structure as the result of the fact that a second unit wiring layer 9 is laminated and formed on the principal surface of a first unit wiring layer 8 via steps which will be described later to laminate and form in order a third unit wiring layer 10 to a fifth unit wiring layer 12 on the principal surface of the second layer unit wiring layer 9 at times subsequent thereto. In this circuit module 1, the multi-layer wiring circuit portion 2 is interlayer-connected through via hole 13 formed in a manner penetrated through all layers, upper and lower layers or plural layers of the first to five unit wiring layers 8 to 12. In addition, at the circuit module 1, digital circuit networks in which fineness, miniaturization and high density have been realized are formed within the multi-layer interconnection (wiring) circuit portion 2 via steps which will be described later.

In the circuit module 1 according to the present invention, as described later, at the first to fifth unit wiring layers 8 to 12 of the multi-layer wiring circuit portion 2, there is provided the socalled via hole-on-via hole (Via-on-Via) structure in which via holes of the upper layer unit wiring layer side are directly formed on via holes of the lower layer unit wiring layer side. The circuit module 1 is mounted onto the mother board 3 so that supply of predetermined signals and power is conducted from circuit portions of the mother board 3 side to the multi-layer wiring circuit portion 2. Accordingly, in the circuit module 1 according to the present invention, the mother board 3 and semiconductor chips 6A, 6B mounted on second principal surface 2b of the multi-layer wiring circuit portion 2 are directly connected through via holes 13. Thus, shortening of wiring length is realized. In this circuit module 1, there is conducted connection in which attenuation of transmission signals between the mother board 3 and the semiconductor chips 6A, 6B has been reduced, and connection in which signal delay has been minimized.

In the circuit module 1 according to the present invention, as described later, polishing processing is implemented to the semiconductor chips 6A, 6B and the sealing resin layer 7 to provide thin structure. Thus, thin structure of the entirety is realized. At the circuit module 1, as described later, the multilayer wiring circuit portion 2 is adapted so that first unit wiring layer 8 is formed on a base substrate 20 provided with a peeling layer 21 on planar principal surface, and second unit wiring layer 9 to fifth unit wiring layer 12 are formed in order on the first layer unit wiring layer 8 at times subsequent thereto. The multilayer wiring circuit portion 2 is peeled off from the base substrate 20 through the peeling layer 21 after undergone a predetermined step or steps. In this example, the base substrate 20 is re-used after processing such as rinse, etc. is implemented thereto.

At the circuit module 1 according to the present invention, the multilayer wiring circuit portion 2 is adapted as described later so that first unit wiring layer 8 is formed on base substrate 20 having flat surface and unit wiring layers of the upper layer are formed in order in the state where principal surfaces of the respective unit wiring layers including this first unit wiring layer 8 are flattened. Accordingly, the circuit module 1 is formed in the state where respective wiring patterns of the first to fifth unit wiring layers 8 to 12 is caused to have high accuracy and high density, and are caused to be of thin structure. At the circuit module 1, as the result of the fact that the multi-layer wiring circuit portion 2 is caused to be of thin structure, lengths of wirings which connects respective semiconductor chips 6A, 6B therebetween are further shortened.

At the circuit module 1, within the multilayer wiring circuit portion 2, capacitor elements 14, resistor elements 15 and/or inductor elements 16 of the spiral type are formed as film by the thin film technology or the thick film technology. The capacitor element 14 is, e.g., decoupling capacitor or capacitor for cutting d.c. component, and is constituted by tantalum oxide (TaO) film or tantalum nitride (TaN) film. The resistor element 15 is, e.g., resistor for termination resistor, and is constituted by TaN film. At the circuit module 1, since first unit wiring layer 8 to fifth layer unit wiring layer 12 are formed in such a manner that they are laminated in order on the planar surface of the base substrate 20 or the unit wiring layer of the lower layer as described above, the capacitor elements 14, the resistor elements 15 and/or the inductor elements 16 which have high accuracy are formed. At the circuit module 1, since passive elements such as the capacitor element, the resistor element and/or the inductor element, etc. which have conventionally used chip parts are formed within the multi-layer wiring circuit portion 2, passive elements which are extremely small and have high performance can be mounted in the state where wiring lengths thereof has been shortened.

The circuit module 1 according to the present invention is manufactured via process steps which will be described later, and the first unit wiring layer 8 to the fifth layer unit wiring layer 12 are respectively constituted by first insulating layer 22, second insulating layer 23 and conductive metal layer 24. In this manufacturing process for circuit module 1, manufacturing steps for the layer unit wiring layer 8 to the fifth layer unit wiring layer 12 respectively consist of a formation step for via hole groove 25 which forms via hole 13 with respect to the first insulating layer 22, and a formation step for wiring groove 27 for forming wiring patterns 26 including, at a portion thereof, communicating portions with via hole groove 25 with respect to the second insulating layer 23. In the manufacturing process for circuit module 1, manufacturing processes for the first unit wiring layer 8 to the fifth unit wiring layer 12 respectively consist of Cu plating step of forming conductive metal layer 24 with respect to the second insulating layer 23, and Chemical-Mechanical Polishing (CMP) step of polishing conductive metal layer 24. In the manufacturing process for circuit module 1, wiring patterns 26 and via holes 13 are formed via the above-described steps within the first unit wiring layer 8 to the fifth unit wiring layer 12.

The manufacturing process for the circuit module 1 according to the present invention includes a semiconductor chip mounting step of mounting semiconductor chips 6A, 6B onto the first principal surface 2a with respect to the multi-layer wiring circuit portion 2 in which first unit wiring layer 8 to fifth unit wiring layer 12 formed on the base substrate 20 via the above-described steps are laminated and formed, and a sealing resin layer formation step of sealing these semiconductor chips 6A, 6B by sealing resin layer 7.

The manufacturing process for the circuit module 1 includes a polishing step of simultaneously polishing the semiconductor chips 6A, 6B and the sealing resin layer 7, and a peeling step of peeling the multi-layer wiring circuit portion 2 from the first base substrate 20 to manufacture the circuit module 1.

In the manufacturing process for the circuit module 1 according to the present invention, photo-lithographic process of high resolution is implemented to the first insulating layer 22 and the second insulating layer 23 to form via hole grooves 25 and wiring grooves 27. In accordance with the manufacturing process for the circuit module 1, as compared to the conventional manufacturing process of implementing hole processing for via hole and implementing patterning step using opening mask, wet type etching step or plating step, etc. to substrate on which copper foil layer is formed, there is formed circuit module 1 including via holes 13 and/or wiring patterns 26 which have high accuracy and high density and such that fineness and miniaturization have been realized.

As the result of the fact that the circuit module 1 according to the present invention is manufactured by the above-described manufacturing process steps, respective via holes 13 are formed at about several μm and in the state where they are very small and accurate at the first unit wiring layer 8 to the fifth unit wiring layer 12, and respective wiring patterns 26 are also formed to be extremely fine in such a manner that the pitch has several μm level. At the circuit module 1, micro-strip lines such that, e.g., the upper and lower layers are put by ground therebetween are formed at the first unit wiring layer 8 to the fifth unit wiring layer 12 so that impedance-controlled wiring patterns 26 are formed.

As compared to the circuit module manufactured by employing the conventional manufacturing method, the circuit module 1 manufactured by the manufacturing method according to the present invention can be reduced down to about 1/10 in terms of area size, and use limit frequency band can be increased to 20 GHz. In the circuit module 1 according to the present invention, the first layer unit wiring layer 8 to the fifth layer unit wiring layer 12 which constitute the multi-layer wiring circuit portion 2 are formed in the state where thickness thereof is, e.g., about 5 μm, and the entire thickness of the multilayer wiring circuit portion 2 can be held down to about several ten μm. Since the semiconductor chips 6A, 6B are polished precisely and at the maximum so that they have thickness of about 100 μm, the circuit module 1 according to the present invention can be caused to be of thin structure to much degree.

Respective steps of the manufacturing method for the circuit module 1 according to the present invention will be explained in detail with reference to FIGS. 3 to 12.

Figure 1:
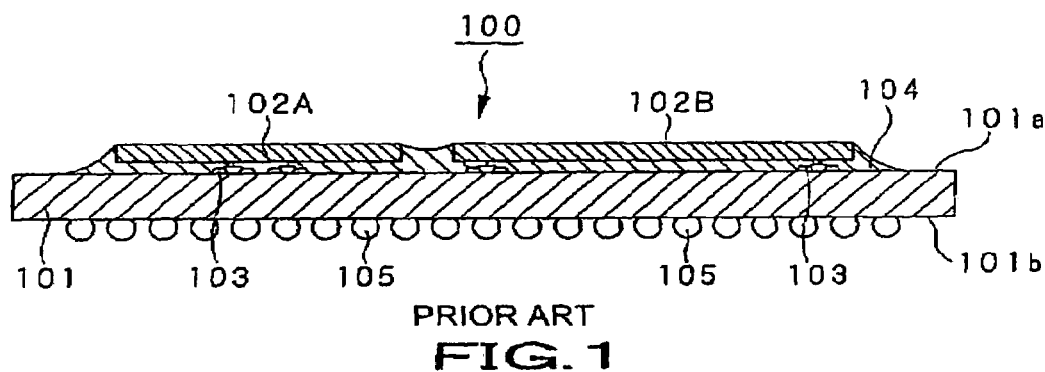
FIG. 1 is a longitudinal cross sectional view showing a conventional circuit module.
Figure 3:
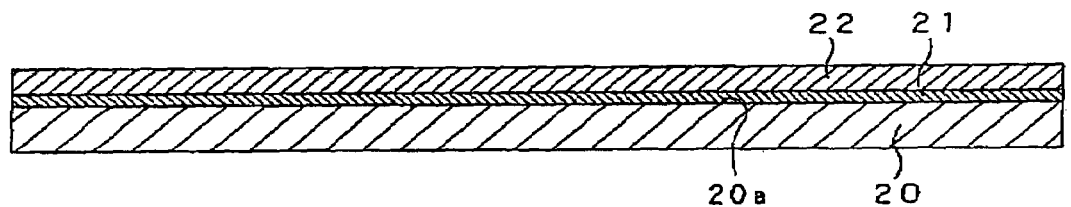
FIG. 3 is a longitudinal cross sectional view showing a formation step for first insulating layer.

In the manufacturing process for circuit module 1 according to the present invention, base substrate 20 formed as shown in FIG. 3 is provided first. The base substrate 20 is formed by substrate material, e.g., Si substrate, glass substrate or quartz substrate, etc. having insulating characteristic, heat-proof characteristic or chemicals proof characteristic, and mechanical rigidity and such that planar surface of high accuracy can be formed. At the base substrate 20, by using such base material, thermal change is suppressed with respect to elevation of surface temperature at the time of sputtering processing which will be described later, and holding of focal depth at the time of photo-lithographic processing and improvement in the contact alignment characteristic are realized so that circuit module 1 of high accuracy can be manufactured. It is to be noted that the base substrate 20 is not limited to the above-described base material, but other substrate suitable material to which planation processing has been implemented may be used.

The base substrate 20 used for the manufacturing method of the present invention is adapted so that polishing processing is implemented to the principal surface 20a to form the principal surface 20a as planar surface of high accuracy, and peeling layer 21 is formed as film on this principal surface 20a. The peeling layer 21 is composed of metallic thin film layer such as copper or aluminum, etc. formed in a manner extending over the entirety with uniform thickness of about 10 µm on the principal surface 20a of the base substrate 20 by, e.g., sputtering method or Chemical Vapor Deposition (CVD), etc. and a resin thin film layer such as polyimide resin, etc. having thickness of about 1 µm to 2 µm formed on the entire surface by, e.g., spin-coat method, etc. on this metallic thin film layer. In the peeling layer 21, at the peeling step which will be described later, multi-layer wiring circuit portion 2 is peeled off from the base substrate 20 with the first layer unit wiring layer 8 being as peeling surface.

In the manufacturing process of the circuit module 1 according to the present invention, first unit wiring layer 8 is formed on the peeling layer 21. In the manufacturing process for the first layer unit wiring layer 8, as shown in FIG. 3, the first step is to form first insulating layer 22 as film on the peeling layer 21 of the base substrate 20. As the first insulating layer 22, e.g., negative type photosensitive insulating resin material of polyimide system or epoxy system is used. The first insulating layer 22 is formed as film over the entire surface thereof on the peeling layer 21 by, e.g., spin-coat method, curtain coat method, roll coat method or dip-coat method which permits coating uniformess characteristic or control characteristic. The first insulating layer 22 is formed as film on flat base substrate 20 through flat peeling layer 21 so that it is formed with uniform thickness.

Figure 4:
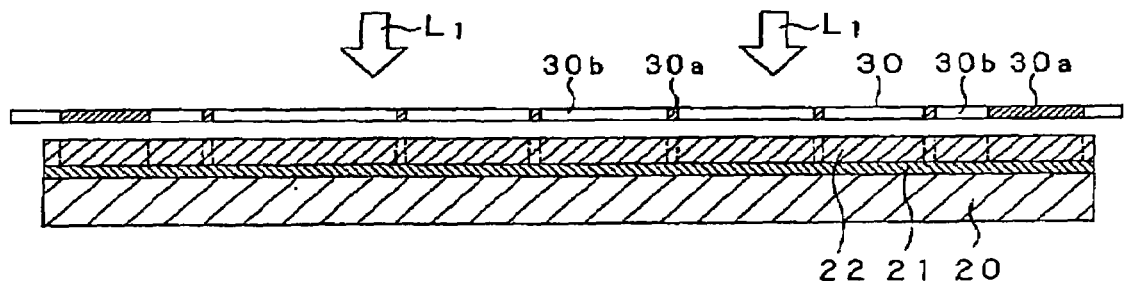
FIG. 4 is a longitudinal cross sectional view showing a first exposure step implemented onto the first insulating layer.

In the manufacturing process for the first unit wiring layer 8, the second step is to implement first photo-lithographic processing to form via hole grooves 25 in correspondence with via holes 13 at first insulating layer 22. The first photo-lithographic processing includes, as shown in FIG. 4, processing for disposing first photo-mask 30 on the surface of the first insulating layer 22 after undergone positioning, first exposure processing for exposing a predetermined portion of the first insulating layer 22 through the first photo-mask 30, and first development processing for developing the first insulating layer 22. As shown in FIG. 4, the first photo-mask 30 is comprised of sheet material where there is formed light shielding/transmitting pattern in which the portion where via hole groove 25 corresponding to via hole 13 is to be formed is caused to be light shielding portion 30a, and other portion is caused to be light transmitting portion 30b, and is disposed on the surface of the first insulating layer 22 in the state it is closely contact therewith after undergone positioning.

Figure 5:
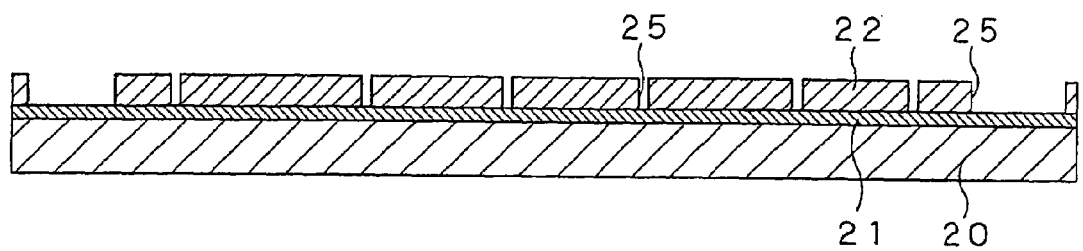
FIG. 5 is a longitudinal cross sectional view showing a first development step implemented onto the first insulating layer.

In the first exposure processing, there is employed a suitable method, e.g., a method of irradiating laser beams caused to undergo operation control in X-Y direction, or a method of irradiating outgoing light from mercury lamp, etc. As shown in FIG. 4, the first insulating layer 22 is selectively exposed by processing light $L_1$ transmitted from the light transmitting portion 30b of the first photo-mask 30. At the first insulating layer 22, the portion except for the portion where via holes 13 are formed as indicated by broken lines in FIG. 4 is selectively exposed over the entire area in the thickness direction by this first exposure processing, and is changed into latent image. In the first development processing, e.g., base substrate 20 to which the first exposure processing has been implemented is immersed into alkali solution to thereby remove, as shown in FIG. 5, unexposed portion of the first insulating layer 22, i.e., the portion where respective via holes 13 are formed to form predetermined via hole grooves 25.

Figure 6:
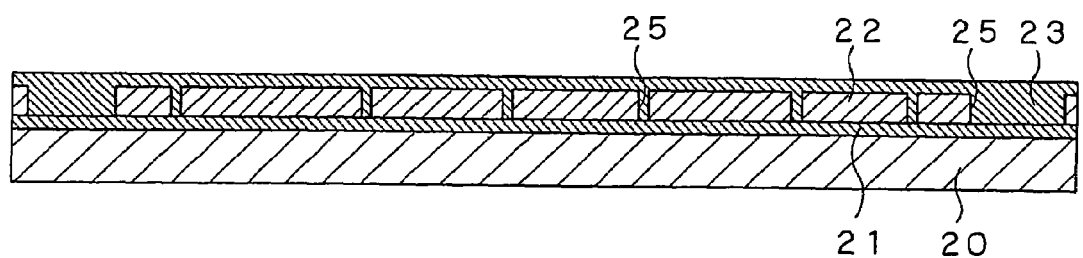
FIG. 6 is a longitudinal cross sectional view showing a formation step for second insulating layer.

In the manufacturing process for the first unit wiring layer 8, the third step is to form second insulating layer 23 as fim on the first insulating layer 22 where via hole grooves 25 are formed as shown in FIG. 6 is caused to be third step. Also as the second insulating layer 23, similarly to the first insulating layer 22, e.g., negative type photosensitive insulating resin material of polyimide system or epoxy system is used. The second insulating layer 23 is formed as film with uniform film thickness over the entire surface on the first insulating layer 22 by, e.g., spin coat method, curtain coat method, roll coat method or dip-coat method, etc. which permits coating uniform characteristic or thickness control characteristic. As shown in FIG. 6, insulating resin material is filled also within via hole grooves 25 formed at the first insulating layer 22 by the first step.

Figure 7:
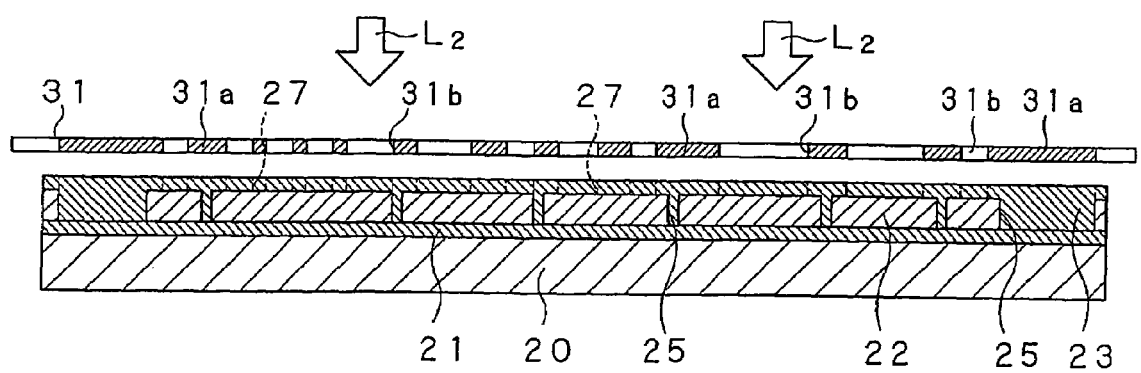
FIG. 7 is a longitudinal cross sectional view showing a second exposure step implemented onto the second insulating layer.

In the manufacturing process for the first unit wiring layer 8, the fourth step is to implement second photo-lithographic processing to form wiring grooves 27 in correspondence with wiring patterns 26 at the second insulating layer 23. The second photo-lithographic processing also includes, as shown in FIG. 7, processing for disposing second photo-mask 31 on the surface of the second insulating layer 2, second exposure processing for exposing a predetermined portion of the second insulating layer 23 through the second photo-mask 31, and second development processing for developing the second insulating layer 23. As shown in FIG. 7, the second photo-mask 31 is comprised of sheet material where there is formed light shielding/light transmitting pattern in which the light shielding portion 31a where wiring groove 27 corresponding to wiring pattern 26 is to be formed is caused to be light shielding portion 31a and other portion is caused to be light transmitting portion 31b, and is disposed on the surface of the second insulating layer 23 in the state where it is closely in contact therewith after undergone positioning.

Figure 8:
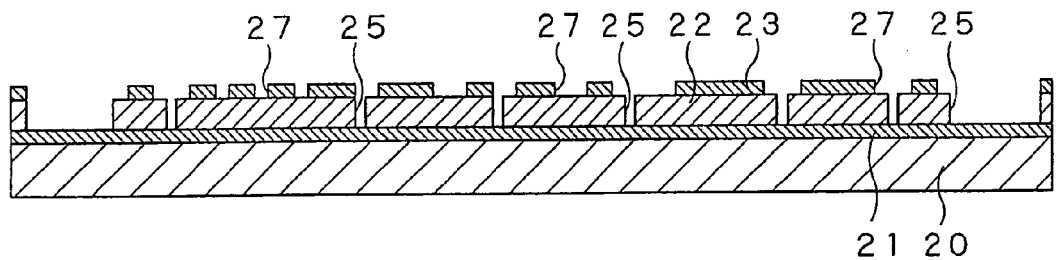
FIG. 8 is a longitudinal cross sectional view showing a second development step implemented onto the second insulating layer.

Also in the second exposure processing, the same exposure unit as the above-described first exposure processing is used, and the second insulating layer 23 is selectively exposed by processing light $L_2$ transmitted from the light transmitting portion 31b of the second photo-mask 31. In the second exposure processing, as indicated by broken lines in FIG. 7, the portion except for corresponding portion of the wiring pattern 26 is selectively exposed over the entire area in the thickness direction at the second insulating layer 23 to conduct realization of latent image. In the second development processing, e.g., base substrate 20 to which the second exposure processing has been implemented is immersed into alkali solution to thereby remove, as shown in FIG. 8, unexposed portion of the second insulating layer 23, i.e., corresponding portion of insulating resin material filled within respective via hole grooves 25 and patterns 26 to form, as pattern, wiring grooves 27 along with predetermined via hole grooves 25.

Figure 9:
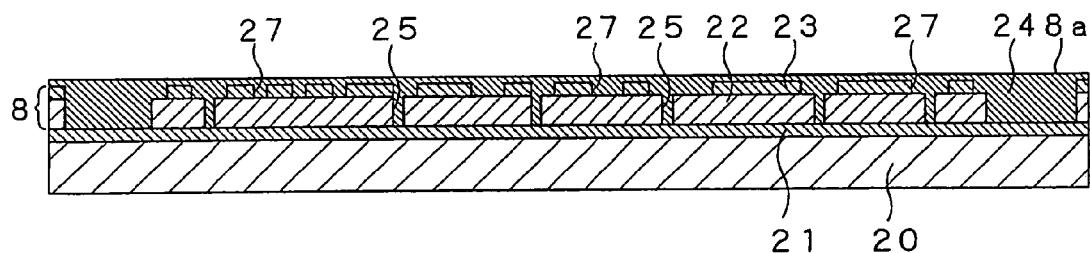
FIG. 9 is a longitudinal cross sectional view showing a formation step for conductive metal layer implemented onto the second insulating layer.

In the manufacturing process for the first unit wiring layer 8, the fifth step is to implement metal plating processing to the second insulating layer 23 in which via hole groove 25 and wiring groove 27 have been formed to form, as film, conductive metal layer 24. As the metal plating processing, either electrolytic plating or electroless plating may be employed. As shown in FIG. 9, conductive metal layer 24 having a predetermined thickness is formed on the entire surface of the second insulating layer 23 in such a manner that conductive metal is filled up to the inside of the wiring groove 27 along with the via hole grooves 25. As the metal plating processing, specifically copper plating is implemented to the conductive metal layer 24 for the purpose of forming copper film layer having excellent conductivity. In the case where conductive metal layer 24 is formed by electrolytic plating, peeling layer 21 is utilized as voltage application electrode.

Figure 10:
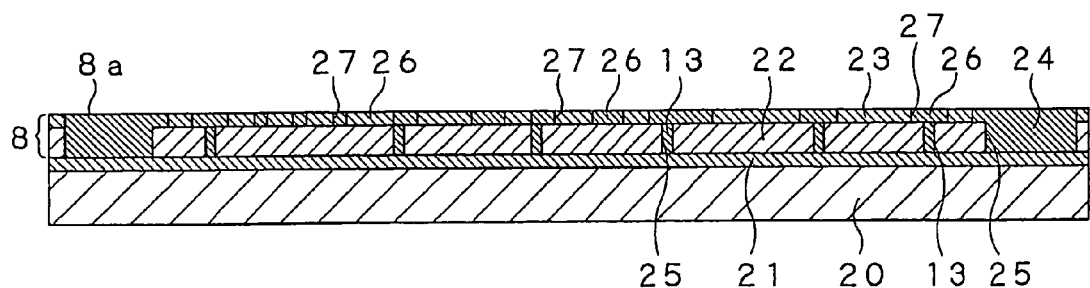
FIG. 10 is a longitudinal cross sectional view showing polishing step of implementing chemical-mechanical polishing processing to conductive metallic layer.

In the manufacturing process for the first unit wiring layer 8, the sixth step is to polish the conductive metal layer 24 until the principal surface of the second insulating layer 23. In the polishing processing, a portion of the second insulating layer 23 is polished along with the conductive metal layer 24 to thereby form the principal surface 8a of the first unit wiring layer 8 so that it results in flat surface as shown in FIG. 10. Since the second insulating layer 23 and the conductive metal layer 24 which are different in material are simultaneously polished, polishing processing is performed by CMP method having polishing selectivity such that polishing rate of the conductive metal layer 24 is increased.

In the manufacturing process for the first unit wiring layer 8, the above-described polishing processing is implemented to thereby manufacture, as shown in FIG. 10, conductive metal which has been filled into the via hole grooves 25 and the wiring grooves 27, i.e., first layer unit wiring layer 8 where copper layer is exposed in such a manner to constitute the same surface as the second insulating layer 23 so that via holes 13 and wiring patterns 26 are respectively formed. At the first unit wiring layer 8, as described above, first insulating layer 22 and second insulating layer 23 are formed with thickness of high accuracy on the base substrate 20, and via holes 13 and wiring patterns 26 are formed by via hole grooves 25 and wiring grooves 27 which have been formed as the result of the fact that the first and second photo-lithographic processing of high resolution have been implemented.

Accordingly, the first unit wiring layer 8 is constituted so as to be of thin structure on the whole, but sufficient signal transmission characteristic can be held because the wiring pattern 26 has thickness equal to the thickness of the second insulating layer 23. At the first layer unit wiring layer 8, the via hole grooves 25 and the wiring grooves 27 are formed at the first insulating layer 22 and the second insulating layer 23 in the state where they have high density, are fine and are miniaturized. Thus, via holes 13 and wiring patterns 26 in which high density, fineness and miniaturization have been realized are formed. At the first unit wiring layer 8, although the detail is omitted, connection pads and/or input/output electrodes adapted to be mounted on mother board 3 are formed along with wiring pattern 26.

It is to be noted that while the first insulating layer 22 and the second insulating layer 23 are formed as film by negative type photosensitive insulating resin material in the above-described manufacturing process for the first unit wiring layer 8, they may be formed as film by positive type photosensitive insulating resin material. In such manufacturing process, the first and second photo-masks 30 and 31 are adapted so that portions corresponding to via hole grooves 25 and/or wiring grooves 27 are caused to be light transmitting portion, and other portions are caused to be light shielding portion. In addition, in such manufacturing process, since exposure up to the first insulating layer 22 is conducted in the second exposure processing, it is necessary to perform control of exposure quantity.

In the manufacturing process for circuit module 1, manufacturing process for second unit wiring layer 9 is implemented onto the flattened principal surface 8a of the above-described first unit wiring layer 8. In the manufacturing process for second unit wiring layer 9, after first insulating layer 22 is formed as film on the principal surface 8a of the first unit wiring layer 8, a step of implementing first photo-lithographic processing for forming the above-described via hole groove 25, a step of forming second insulating layer 23, a step of implementing second photo-lithographic processing for forming wiring groove 27, a step of forming conductive metal layer 24, and a polishing processing are implemented. In the manufacturing process for second layer unit wiring layer 9, although the detail is omitted, passive elements such as capacitor elements 14, resistor elements 15 and/or inductor elements 16, etc. are also formed by suitable method.

Figure 11:
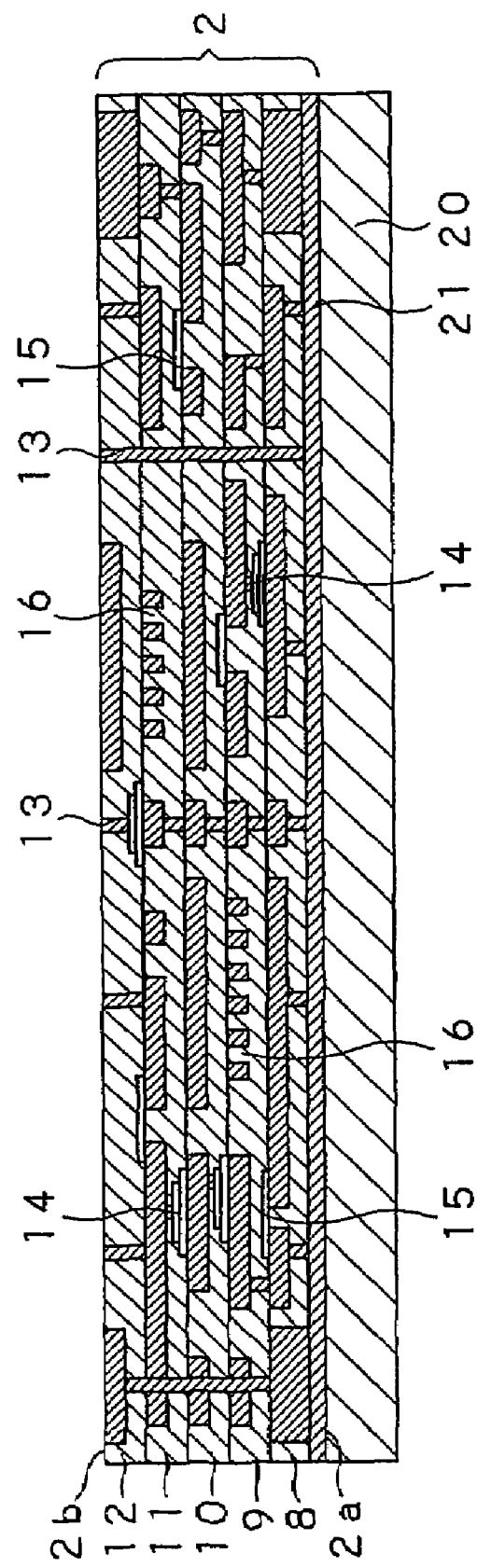
FIG. 11 is a longitudinal cross sectional view showing multilayer wiring circuit portion formed on base substrate.

In the manufacturing process for circuit module 1, manufacturing process for third unit wiring layer is implemented onto second layer unit wiring layer 9 and steps of forming unit wiring layers of upper layers are implemented in order at times subsequent thereto. Thus, as shown in FIG. 11, multi-layer wiring circuit portion 2 is manufactured on the base substrate 20. At the multi-layer wiring circuit portion 2, as shown in FIG. 11, via holes 13 formed at the first unit wiring layer 8 to the fifth unit wiring layer 12 are adapted so that via holes of the upper layer side are directly formed on via holes of the lower layer side to constitute via hole-on-via hole structure. Accordingly, at the multi-layer wiring circuit portion 2, the first unit wiring layer 8 to the fifth unit wiring layer 12 are connected with the shortest wiring length. At the multilayer wiring circuit portion 2, since unit wiring layers of the upper layer are formed in order on unit wiring layers of the flattened lower layer, influence by accumulation of thickness of wiring patterns of the lower layer side is suppressed so that the fifth unit wiring layer 12 of the uppermost layer is formed in the state where warp, waviness or uneven portion does not exist. Accordingly, at the multilayer circuit portion 2, unit wiring layers of high accuracy are further formed on the fifth unit wiring layer 12 to permit high integration.

Figure 12:
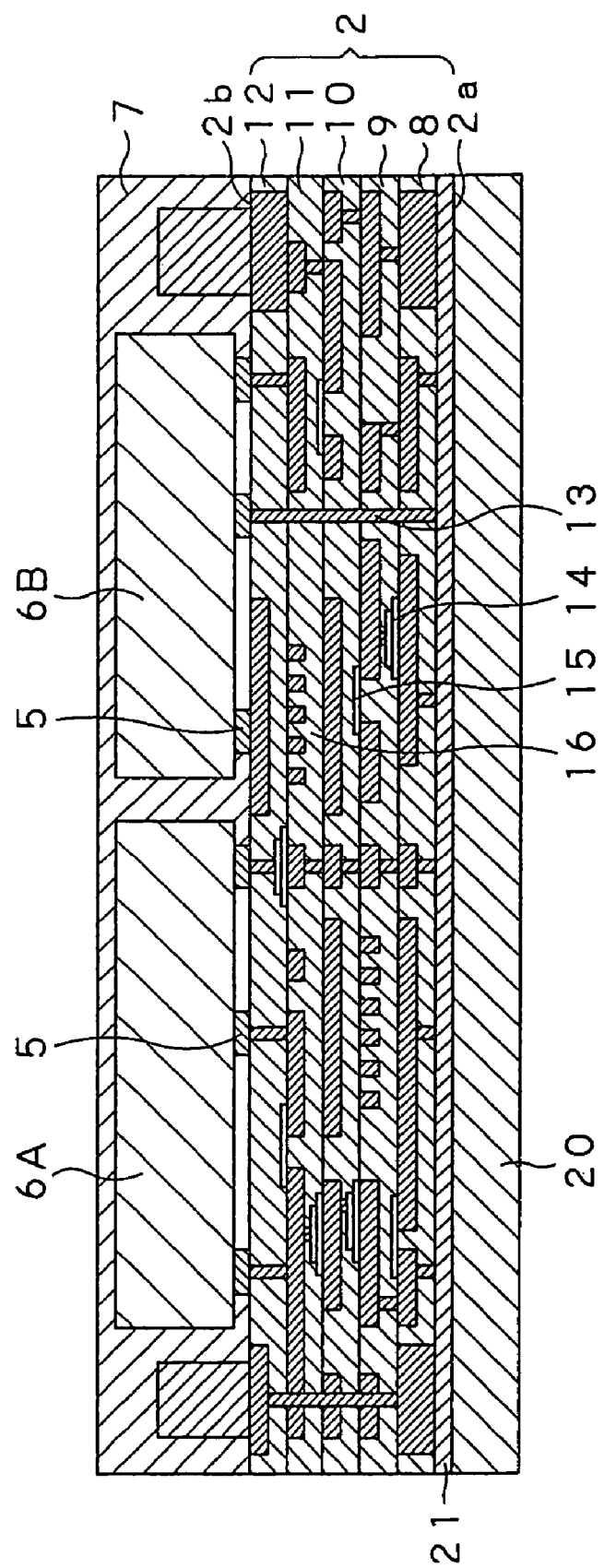
FIG. 12 is a longitudinal cross sectional view showing a step of mounting semiconductor chips onto multi-layer wiring circuit portion.

In the manufacturing process for circuit module 1, as shown in FIG. 12, a step of mounting semiconductor chips 6A, 6B is implemented onto the principal surface of the fifth unit wiring layer 12 constituting the second principal surface 2b of the multi-layer wiring circuit portion 2. At the fifth unit wiring layer 12, although the detail is omitted, similarly to the wiring pattern 26, electrode pads for mounting semiconductor chips 6A, 6B by suitable mounting method such as flip-chip mounting method, etc. and/or connection terminal portions for conducting connection to other electronic parts or other modules, etc. are formed. In this example, e.g., electroless nickel/copper plating is implemented to electrode pad or connection terminal portion so that electrode formation is performed. Although the detail is omitted, the step of mounting semiconductor chip consists of a step of attaching mounting bump 5 onto electrodes of the semiconductor chips 6A, 6B, a step of mounting the semiconductor chips 6A, 6B on the fifth unit wiring layer 12 after undergone positioning, and a step of implementing, e.g., reflow soldering processing, etc.

In the manufacturing process for the circuit module 1, as shown in FIG. 12, a sealing step of sealing mounted semiconductor chips 6A, 6B by sealing resin layer 7 is implemented. The sealing resin layer 7 is molded by transfer mold method or printing method, etc. by using resin material having small thermal hardening contraction percentage, such as, for example, epoxy system resin, etc. so that generation of stress to produce warp, etc. at the base substrate 20 or the multilayer wiring circuit portion 2 after hardening is suppressed.

Figure 13:
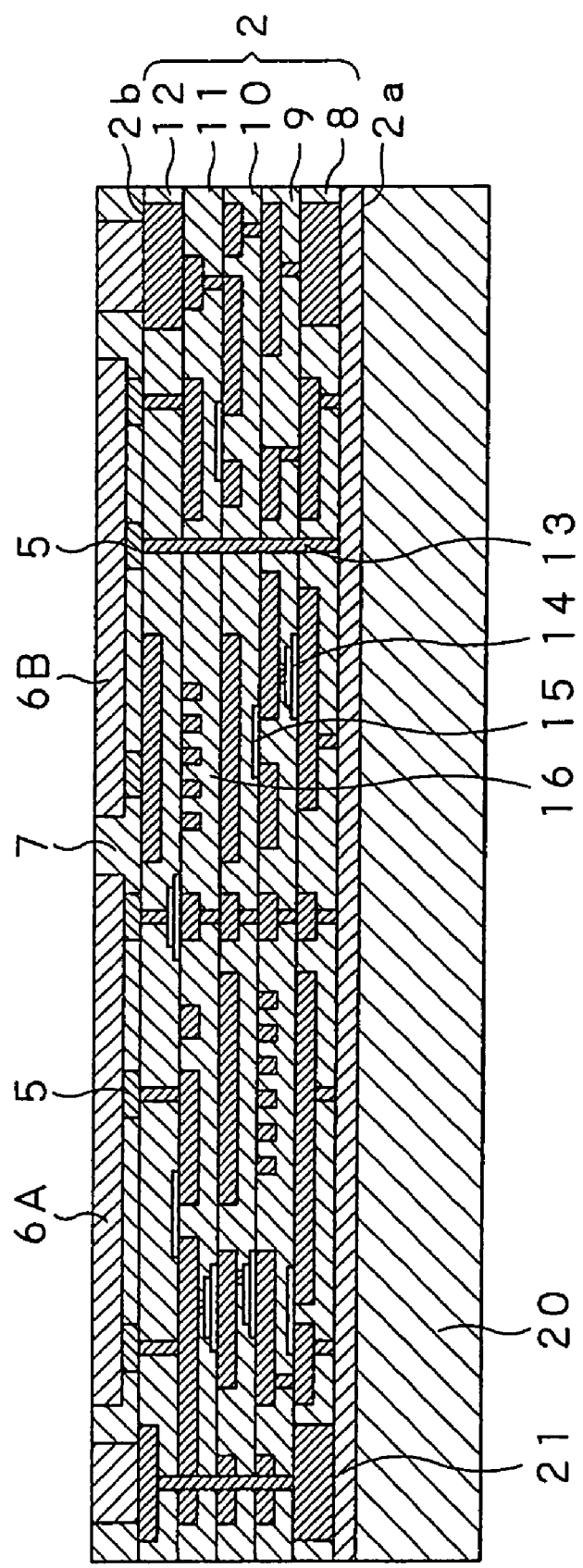
FIG. 13 is a longitudinal cross sectional view showing polishing step of implementing polishing processing to semiconductor chip and sealing resin layer.

In the manufacturing process for the circuit module 1, a step of polishing the semiconductor chips 6A, 6B and the sealing resin layer 7 so that they have a predetermined thickness is implemented. The polishing step is conducted by, e.g., mechanical polishing method using grinder, chemical polishing method by wet etching, or CMP in which mechanical polishing method and chemical polishing method are used in combination, etc., wherein the surfaces of the semiconductor chips 6A, 6B are polished along with the sealing resin layer 7 within the maximum range where there is no hindrance in function to thereby provide thin structure as shown in FIG. 13. In the polishing step, the semiconductor chips 6A, 6B are polished in the state where they are sealed by sealing resin layer 7 with the base substrate 20 being as a supporting substrate to thereby conduct polishing at the maximum and precisely in such a manner that damage such as edge defect, etc. does not take place at respective semiconductor chips 6A, 6B.

In the manufacturing process for the circuit module 1, although the detail is not provided herein, after second base substrate including peeling layer is connected (bonded) to the sealing resin layer 7 to which polishing processing has been implemented, a step of peeling circuit module 1 from the base substrate 20 is implemented. The second base substrate constitutes a base in forming electrode pads at the first unit wiring layer 8 which constitutes the first principal surface 2a of the multi-layer wiring circuit portion 2 or implementing planation processing for the purpose of mounting circuit module 1 onto the mother board 3, etc.

In the base substrate peeling step, the base substrate 20 where the circuit module 1 has been formed via the above-described steps is immersed into acid solution, e.g., hydrochloric acid, etc. At the circuit module 1, peeling proceeds at the surface between the metallic thin film layer and the resin thin film layer of the peeling layer 21 within the acid solution, and the circuit module 1 is peeled off from the base substrate 20 in the state where the resin thin film layer is left at the first unit wiring layer 8 side. It is to be noted that the peeling step may be adapted to implement, e.g., laser abrasion processing to thereby peel off the circuit module 1 from the base substrate 20. In addition, resin thin film layer left at the first unit wiring layer 8 side is removed by, e.g., dry etching method by oxygen plasma, etc.

An electrode formation processing to form Au—Ni layer by electroless plating on the surfaces of connection pads and/or input/output terminals formed at the first unit wiring layer 8 exposed to the first principal surface 2a is implemented to the multi-layer wiring circuit portion 2. The circuit module 1 is mounted in such a manner that mounting bump 4 is attached to the connection pad and reflow soldering is implemented in the state where it has been caused to undergo positioning at the mother board 3. In this example, at the circuit module 1, prior to the step of mounting the mother board 3, a step of peeling off the second base substrate is implemented.

While the step of manufacturing one circuit module 1 on the base substrate 20 has been explained in the above-described manufacturing process for circuit module 1, relatively large base substrate 20 may be used to collectively manufacture a large number of circuit modules 1. In the manufacturing process for circuit module 1, in this case, cutting processing for connecting portion which separates respective circuit modules 1 is implemented prior to the peeling step from the base substrate 20. In addition, while circuit module 1 is manufactured on base substrate 20 comprised of Si substrate or glass substrate in the manufacturing process for the circuit module 1, e.g., various organic substrates used in general manufacturing process for multi-layer substrate to which planation processing has been implemented may be used.

While the circuit module 1 according to the present invention is caused to be of the configuration in which the multilayer wiring circuit portion 2 also has an interposer which mounts semiconductor chips 6A, 6B, it is a matter of course that such circuit module may be used as single multi-layer wiring circuit module. In addition, it is a matter of course that the circuit module 1 may be adapted so that semiconductor chips and/or mounting parts may be mounted also at the principal surface 2a side of the multilayer wiring circuit portion 2. At the circuit module 1, in this case, planation processing is implemented also to the first principal surface 2a side with the second base substrate being as base.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

INDUSTRIAL APPLICABILITY

As described above, in the present invention, respective unit wiring layers are adapted so that photo-lithographic processing is implemented to first insulating layer formed by photosensitive insulating resin material to form via hole grooves, and photo-lithographic processing is implemented to second insulating layer formed by photosensitive insulating resin material on the first insulating layer to form wiring grooves to implement polishing processing to the conductive metal layer formed on the second insulating layer so that conductive metal is filled into the via hole grooves and the wiring grooves until the principal surface of the second insulating layer is exposed to form via holes and wiring patterns by the conductive metal filled within the via hole grooves and the wiring grooves. Accordingly, micro and fine via holes and/or wiring patterns are formed at high density by photo-lithographic processing of high resolution so that miniaturization and thin structure are realized. In accordance with the present invention, since respective unit wiring layers are interlayer-connected at the shortest distance by via-on-via structure, attenuation of transmission signals based on shortening of wiring length is reduced, delay of transmission is minimized, and influence of noise is also reduced. Thus, improvement in reliability is realized, and countermeasure of large capacity, high speed and high density bus can be realized.

The invention claimed is:

1. A method of manufacturing a multi-layer interconnection circuit module in which plural unit wiring layers are connected to each other through via holes so that they are laminated and formed, comprising:
   forming a first insulating layer of a photosensitive insulating material,
   implementing photo-lithographic processing to the first insulating layer to form via holes,
   coating a second insulating layer of a photosensitive insulating material over the entire surface of the first insulating layer without forming any metal layer over the first insulating layer, implementing photo-lithographic processing on the second insulating layer to form wiring grooves corresponding to wiring patterns including communicating portions with the respective via holes, thereafter filling conductive metal in the respective via holes and in the wiring grooves by applying a conductive metal layer over the entire surface of the second insulating layer, and polishing the conductive metal layer until the principal surface of the second insulating layer is exposed, wherein the polishing processing is implemented so that the wiring patterns formed by the conductive metal filled in the respective via holes and the respective wiring grooves are polished until a principal surfaces of the wiring patterns are even with the principal surface of the second insulating layer, and wherein the unit wiring layer of the first layer is adapted so that the first insulating layer is formed over a base substrate, and a unit wiring layer of an upper layer is adapted so that a respective first insulating layer of said upper layer is formed over the principal surface of the second insulating layer of the first layer.

2. The method of manufacturing the multi-layer interconnection circuit module as set forth in claim 1, wherein the photosensitive insulating material used to form the first insulating layer and to form the second insulating layer is negative type photosensitive insulating material.

3. The method of manufacturing the multi-layer interconnection circuit module as set forth in claim 1, wherein a polishing step with respect to the conductive metal layer is a polishing processing by a chemical-mechanical polishing method.

4. The method of manufacturing the multi-layer interconnection circuit module as set forth in claim 1, wherein forming the conductive metal layer on the respective second insulating layer comprises implementing copper plating to form a copper layer.

5. The method of manufacturing the multi-layer interconnection circuit module as set forth in claim 1, wherein the unit wiring layer of the first insulating layer is formed over a peeling layer formed over a principal surface of a base substrate, the method including forming the unit wiring layer of a predetermined layer thereafter to peel it through the peeling layer.

6. The method of manufacturing the multi-layer interconnection circuit module as set forth in claim 1, the method including mounting IC chips, LSIs and/or mounting parts onto the unit wiring layer of an uppermost layer.

* * * * *